(12) United States Patent
Powell et al.

(10) Patent No.: US 7,415,379 B2
(45) Date of Patent: Aug. 19, 2008

(54) COLPITTS TRANSMITTER PCB TESTING DEVICE

(75) Inventors: Mark A. Powell, Ortonville, MI (US); Charles F. Muma, Swartz Creek, MI (US)

(73) Assignee: Continental Automotive Systems US Inc., Auburn Hills, MI (US)

( * ) Notice: Subject to any disclaimer, the term of this patent is extended or adjusted under 35 U.S.C. 154(b) by 83 days.

(21) Appl. No.: 11/313,410

(22) Filed: Dec. 21, 2005

(65) Prior Publication Data

US 2006/0208740 A1 Sep. 21, 2006

Related U.S. Application Data

(60) Provisional application No. 60/662,929, filed on Mar. 17, 2005.

(51) Int. Cl.
*G06F 11/273* (2006.01)
*G06F 17/00* (2006.01)

(52) U.S. Cl. .................. 702/122; 702/117; 702/63; 702/108; 340/426.36

(58) Field of Classification Search ................ 702/122; 324/425, 426, 434, 435, 457
See application file for complete search history.

(56) References Cited

U.S. PATENT DOCUMENTS

| | | | |
|---|---|---|---|
| 4,973,285 A * | 11/1990 | Diotte | 40/538 |
| 5,850,188 A * | 12/1998 | Doyle et al. | 340/825.69 |
| 6,643,598 B2 * | 11/2003 | Leichtfried et al. | 702/107 |
| 6,657,214 B1 * | 12/2003 | Foegelle et al. | 250/506.1 |
| 6,980,095 B2 * | 12/2005 | Wright et al. | 340/426.36 |
| 7,166,812 B2 * | 1/2007 | White et al. | 200/341 |
| 2002/0030602 A1 * | 3/2002 | Johnson et al. | 340/825.36 |
| 2004/0127248 A1 * | 7/2004 | Lin et al. | 455/550.1 |
| 2004/0183541 A1 * | 9/2004 | Hald et al. | 324/433 |
| 2006/0023442 A1 * | 2/2006 | De Los Santos et al. | 361/814 |
| 2006/0049922 A1 * | 3/2006 | Kolpasky et al. | 340/426.13 |
| 2006/0127752 A1 * | 6/2006 | Gray et al. | 429/129 |
| 2006/0170610 A1 * | 8/2006 | Rabinovich et al. | 343/895 |
| 2006/0233356 A1 * | 10/2006 | Lu et al. | 379/433.01 |

* cited by examiner

*Primary Examiner*—Hal D Wachsman
(74) *Attorney, Agent, or Firm*—Carlson, Gaskey & Olds

(57) ABSTRACT

A testing device and method for testing a printed circuit board (PCB) for a remote keyless entry fob includes a battery simulator cell to simulate the effects of a remote keyless entry fob battery. The battery simulator cell is located in an upper portion of a testing device housing and is preferably a brass or copper mass of the same size, shape and mass of a typical battery. The lower portion of the housing has a mount for the PCB. At least one circuit board locator is mounted to the upper portion of the housing to apply pressure to the PCB to retain the PCB in the correct position during testing, and to ensure the proper distance between the PCB and the battery simulator cell. A receiving antenna is located proximate the test device for receiving a signal.

17 Claims, 2 Drawing Sheets

`US 7,415,379 B2`

COLPITTS TRANSMITTER PCB TESTING DEVICE

The present invention claims the benefit of U.S. Provisional Patent Application No. 60/662,929, filed Mar. 17, 2005.

BACKGROUND OF THE INVENTION

This invention relates an apparatus and method for testing a printed circuit board for a remote keyless entry fob.

A printed circuit board (PCB) is located within a remote keyless entry fob for controlling the operation of the remote keyless entry fob. Many PCBs for remote keyless entry fobs use Colpitts oscillators, as they are ideal for the remote keyless entry fob operation. In a Colpitts style remote keyless entry fob the battery forms an essential part of the antenna for the remote keyless entry fob.

The PCBs are tested prior to assembly within the remote keyless entry fob to ensure proper manufacturing of the PCB. In Colpitts style remote keyless entry fobs because the battery is essential to the operation of the antenna the PCB cannot properly be tested without the housing and the battery for the remote keyless entry fob.

An apparatus and method for testing PCBs in Colpitts remote keyless entry fobs without requiring the housing and battery is needed.

SUMMARY OF THE INVENTION

A testing device and method for testing a printed circuit board for a remote keyless entry fob includes a battery simulator cell to simulate the effects of a remote keyless entry fob battery.

The testing device includes a housing having a upper portion and a lower portion. The housing may be moved between an assembly position having a larger space between the upper portion and the lower portion and a testing position with a reduced space between the upper portion and the lower portion. The housing includes alignment pins that correspond to alignment apertures for aligning the upper portion with the lower portion of the housing. A battery simulator cell is located in the upper portion of the housing. The battery simulator cell has a negative terminal and a positive terminal that are both connected to an external power supply.

The lower portion has a mount, similar in profile to the PCB, to ensure proper positioning of the PCB within the testing device. Mechanical switch actuators are located proximate the mount for activation of a signal when the PCB is placed on the mount. A sending antenna is located within the PCB for sending a signal from the test device. A receiving antenna is located proximate the test device for receiving the signal. The receiving antenna may be connected to a processor, storage medium, or other devices for recording and processing the information.

Accordingly, the testing device provides for testing of a remote keyless entry fob independent of the housing and battery.

These and other features of the present invention can be best understood from the following specification and drawings, the following of which is a brief description.

DETAILED DESCRIPTION OF THE PREFERRED EMBODIMENT

Figure 1:
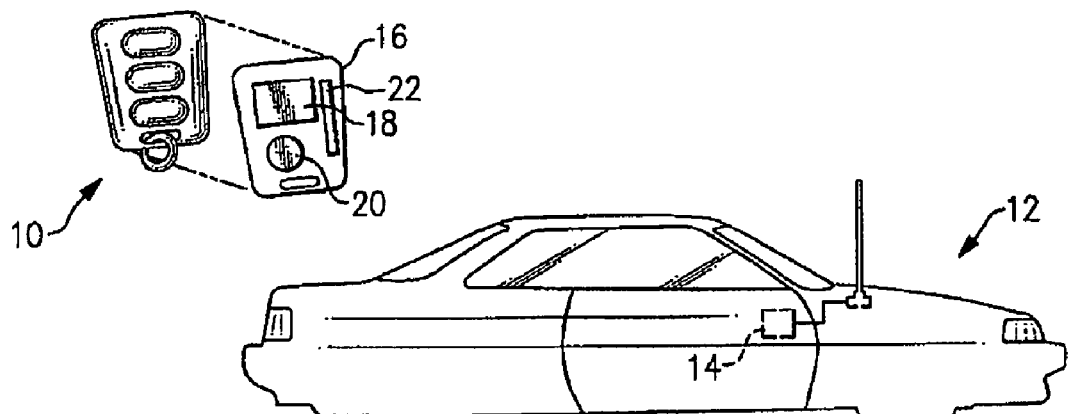
FIG. 1 is an illustration of a remote keyless entry fob and vehicle.

FIG. 1 illustrates a remote keyless entry fob 10 and vehicle 12 having a remote keyless entry system 14. The remote keyless entry fob 10 has a housing 16, printed circuit board (PCB) 18 and a battery 20. An antenna 22 is incorporated with the PCB 18 for sending a signal from the remote keyless entry fob 10 to the vehicle 12 to be received and processed by the remote keyless entry system 14. In addition to providing an energy source for the remote keyless entry fob 10, the battery 20 assists the antenna 22 in sending the signal from the remote keyless entry fob 10 to the vehicle 12. The location of the battery 20 relative to the PCB 18 affects the frequency of the signal as well.

Figure 2:
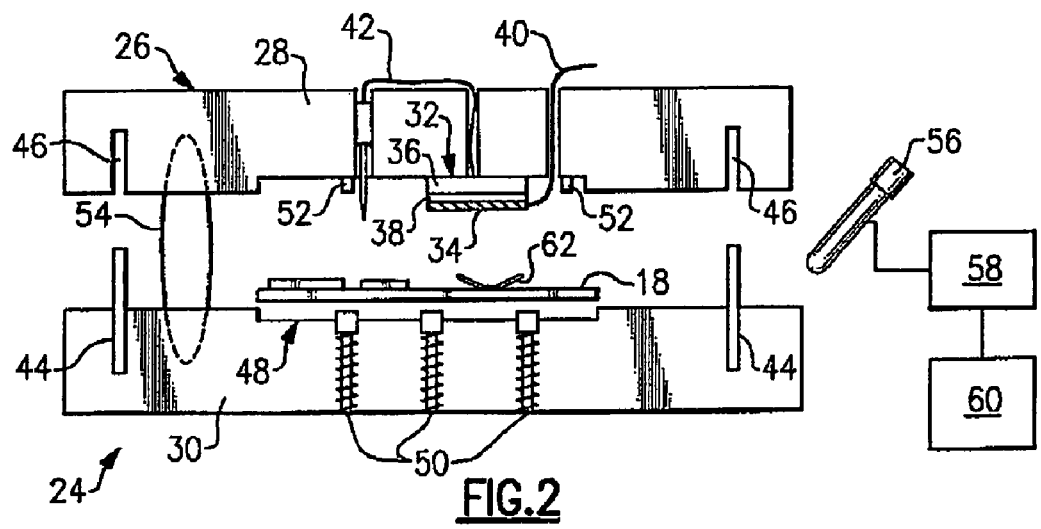
FIG. 2 is an illustration of one embodiment of a testing apparatus of the present invention in the assembly position.

FIG. 2 shows one embodiment of a testing device 24 of the present invention for testing a circuit board 18 of a remote keyless entry fob 10. The testing device 24 can be configured to receive and test a circuit board 18 of any known remote keyless entry fob 10. The testing device 24 includes a housing 26. In the embodiment shown, the housing 26 has an upper portion 28 and a lower portion 30. The housing 26 is shown in an assembly position with a larger space between the upper portion 28 and the lower portion 30. The housing 26 may be moved to a test position (shown in FIG. 3) with a reduced space between the upper portion 28 and the lower portion 30.

A battery simulator cell 32 is located in the upper portion 28 of the housing 26. The battery simulator cell 32 is preferably a brass or copper mass of the same size and shape of a typical battery 20. In addition to simulating the size and shape of the battery, the battery simulator cell 32 is a similar mass as the battery 20. The battery simulator cell 32 may be manufactured from other materials or a combination of materials including brass and copper. The battery simulator cell 32 has a negative terminal 34 and a positive terminal 36. An insulating material 38 is located between the positive terminal 36 and the negative terminal 34. The housing 26 has a negative battery connection 40 which is connected to the negative terminal 34 and a positive battery connection 42 which is connected to the positive terminal 36. The negative battery connection 40 and the positive battery connection 42 are both connected to an external power supply.

The housing 26 includes alignment pins 44 which correspond to alignment apertures 46 for aligning the upper portion 28 with the lower portion 30 of the housing 26. In the embodiment shown, the alignment pins 44 are located in the lower portion 30 and the alignment apertures 46 are located within the upper portion 28. Other arrangements for aligning the upper portion 28 and the lower portion 30 may be utilized. When the housing 26 moves from the assembly position to the test position, the alignment pins 44 enter the alignment apertures 46 ensuring proper axial alignment of the upper portion 28 with the lower portion 30.

The lower portion 30 has a mount 48 to receive a PCB 18 for testing. The mount 48 is similar in profile to the PCB 18 to ensure proper positioning of the PCB 18 within the testing device 24. Mechanical switch actuators 50 are located proximate the mount 48 for activation of sending a signal from the PCB 18 placed on the mount 48. At least one circuit board locator 52 is mounted to the upper portion 28 of the housing 26. The circuit board locator 52 applies pressure to the PCB 18 when it is placed on the mount 48 and the testing device 24 is in the testing position. The circuit board locator 52 retains the PCB 18 in the correct position during testing and ensures the proper distance between the PCB 18 and the battery simulator cell 32.

A sending antenna 54 is incorporated into the PCB 18 for sending a signal from the test device 24. A receiving antenna 56 is located proximate the test device 24 for receiving the signal. The receiving antenna 56 may be connected to a processor 58, storage medium 60, or other devices for recording and processing the information. The PCB 18 may include a barcode that is associated with the data recorded and processed during that test cycle.

Figure 3:
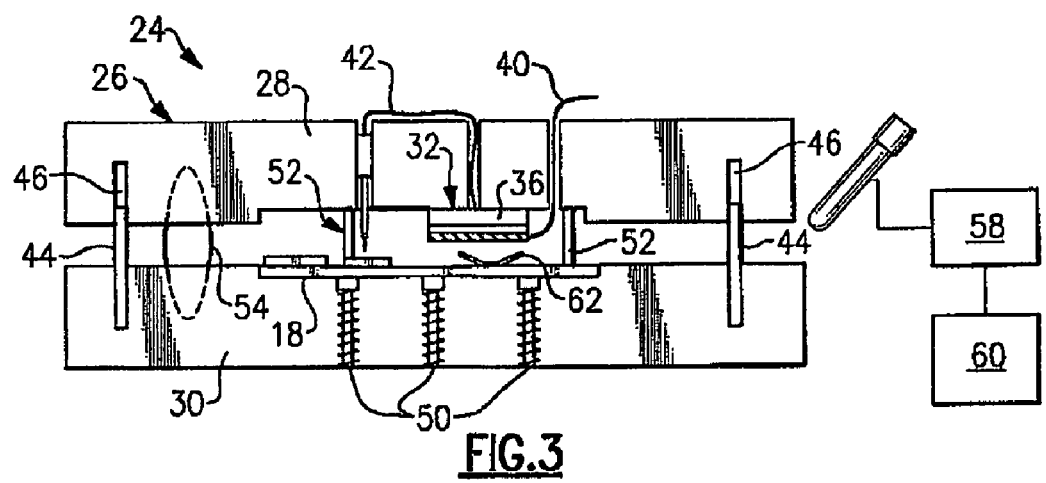
FIG. 3 is an illustration of one embodiment of a testing apparatus of the present invention in the test position.

Referring to FIG. 3, a PCB 18 is placed within the housing 26 on the mount 48. The PCB 18 is positioned such that a negative battery clip 62 on the PCB 18 corresponds to the negative terminal 34 of the battery simulator cell 32. The housing 26 is moved from the assembly position (shown in FIG. 2) to the test position. The circuit board locators 52 ensure the proper distance between the battery simulator cell 32 and the PCB 18. In the test position, the distance between the battery simulator cell 32 and the PCB 18 is similar to the distance between the battery 20 and PCB 18 within the corresponding remote keyless entry fob 10. The distance between the PCB 18 and the battery simulator cell 32 is critical. Variation in the distance between the PCB 18 and battery simulator cell 32 can cause changes in the frequency of the signal.

Figure 4:
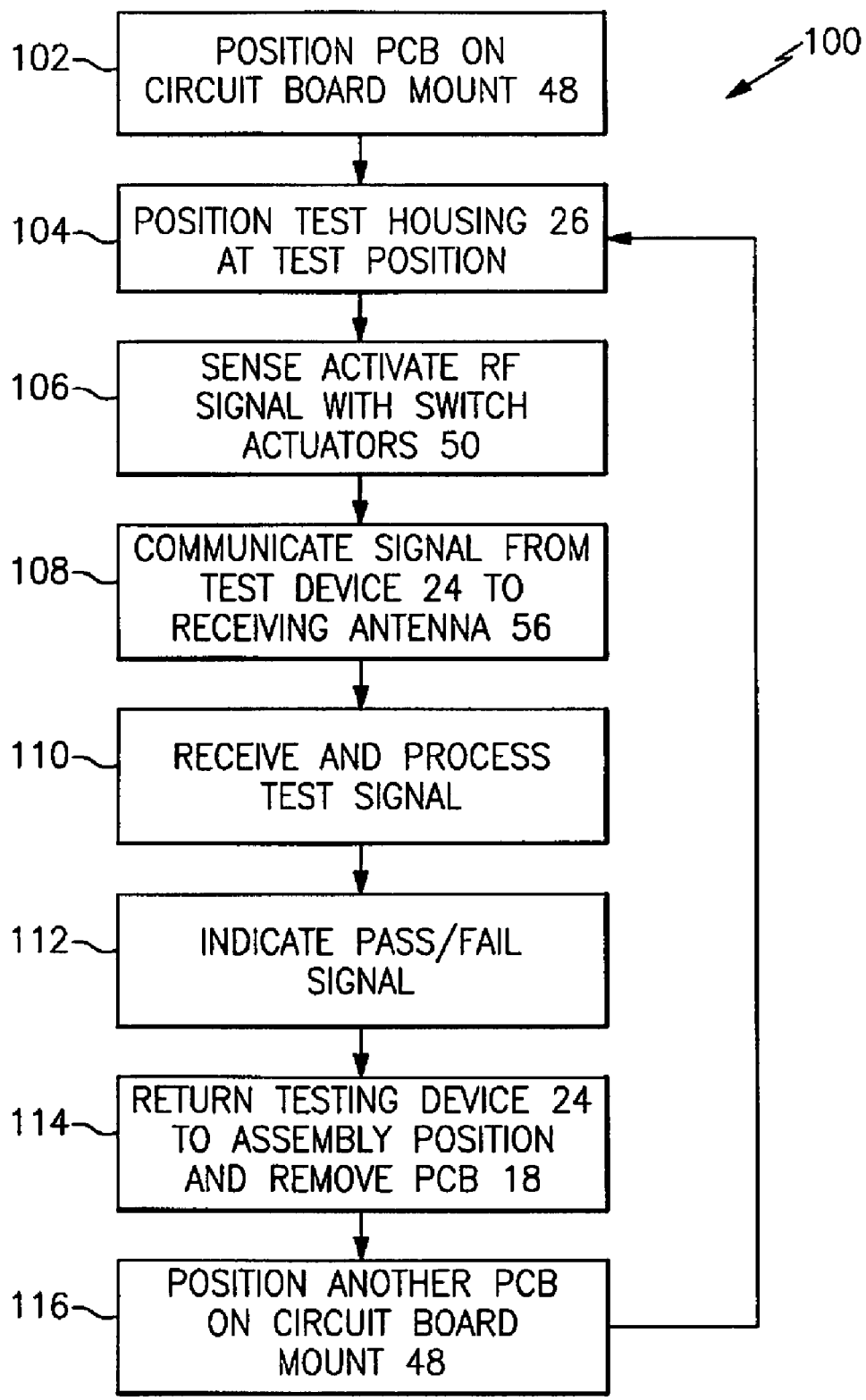
FIG. 4 illustrates a method for testing a PCB of a remote keyless entry fob.

FIG. 4. with continued reference to FIGS. 1-3. illustrates an example method 100 for testing a PCB of a corresponding remote keyless entry fob. At stop block 102, the PCB of a remote keyless entry fob is positioned on the circuit board mount 48 at a predetermined distance from the battery simulator cell 32. The housing 26 is moved to the test position (FIG. 3) at step block 104. Next, at step block 106, the switch actuators 50 sense activate a radio frequency (RE) signal when the housing 26 is in the test position. A signal is sent from the test device 24 to the receiving antenna 56 at step block 108. The battery simulator cell 32 creates a similar effect on the signal as would a battery 20 within a remote keyless entry fob 10. If the PCB 18 has been correctly manufactured the receiving antenna 56 should receive the signal. The signal is received by the receiving antenna 56 and processed at step block 110. Depending on whether the signal meets predefined signal qualifications, the testing device 24 indicates a passing/failing status for the PCB 18 at step block 112. At step block 114, the testing device 24 is moved back to the assembly position and the PCB 18 is removed for assembly within its corresponding remote keyless entry fob 10 for subsequent use with a vehicle 12. Another PCB may then be placed on the PCB mount 48 for another test cycle at step block 116.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A testing device for a remote keyless entry fob circuit board comprising:
   a housing;
   a battery simulator cell assembled within said housing to simulate a battery of a corresponding remote keyless entry fob; and
   a circuit board mount formed in said housing for receiving a circuit board of the corresponding remote keyless entry fob, wherein said battery simulator cell is assembled into an upper portion of said housing and said circuit board mount is formed in a lower portion of said housing, and alignment pins are located in one of said upper portion and said lower portion corresponding to apertures in the other of said upper portion and said lower portion for receiving said alignment pins.

2. The device of claim 1, wherein said circuit board mount has the same profile as said circuit board.

3. The device of claim 1, wherein said battery simulator cell is connected to a negative battery connection located within said housing and positive battery connection located within said housing.

4. The device of claim 1, wherein said battery simulator cell comprises a copper material shaped like a remote keyless entry fob battery.

5. The device of claim 1, wherein said battery simulator cell comprises a brass material shaped like a remote keyless entry fob battery.

6. The device of claim 1, wherein a circuit board locater is located on said housing to maintain a predetermined distance between said battery simulator cell and said circuit board.

7. The device of claim 1, wherein a sending antenna is located within said circuit board for sending a signal, and a receiving antenna is located proximate said housing for receiving said signal.

8. The device of claim 1, wherein said corresponding remote keyless entry fob is a separate and distinct component from said housing.

9. A testing device for a remote keyless entry fob circuit board comprising:
   a battery simulator cell for simulating a battery of a corresponding remote keyless entry fob; and
   a circuit board mount located at a predetermined distance from said battery simulator cell for receiving a circuit board of the corresponding remote keyless entry fob, wherein a sending antenna is located in said circuit board and proximate said battery simulator cell for sending a signal from said testing device, and a receiving antenna is located proximate said battery simulator cell and said circuit board mount for receiving said signal.

10. The device of claim 9, wherein said circuit board mount has the same profile as said circuit board.

11. The device of claim 9, wherein said battery simulator cell is connected to a negative battery connection and to a positive battery connection.

12. The device of claim 9, wherein said battery simulator cell is a copper mass shaped like a remote keyless entry fob battery.

13. The device of claim 9, wherein said battery simulator cell is a brass mass shaped like a remote keyless entry fob battery.

14. A method of testing a remote keyless entry fob circuit board comprising:
   a) providing a battery simulator cell to simulate a battery of a corresponding remote keyless entry fob;
   b) locating a circuit board of the corresponding remote keyless entry fob at a predetermined distance from the battery simulator cell; and
   c) receiving a signal from the circuit board with a receiving antenna, wherein a sending antenna is located in the circuit board and proximate the battery simulator cell for sending a signal, and the receiving antenna is located proximate the battery simulator cell and the circuit board mount for receiving the signal.

15. The method of claim 14, wherein said step b) includes mounting the circuit board on a circuit board mount and moving the circuit board mount to a predetermined distance from said battery simulator cell.

16. The method of claim 14, wherein said step b) includes connecting the battery simulator cell to a negative battery connection and to a positive battery connection.

17. The method of claim 14 further comprising:
   d) processing the signal received by the receiving antenna.

* * * * *